(12) United States Patent
Peschke

(10) Patent No.: US 10,416,203 B2
(45) Date of Patent: Sep. 17, 2019

(54) TEST AND MEASUREMENT SYSTEM, DIFFERENTIAL LOGIC PROBE, SINGLE ENDED LOGIC PROBE AND METHOD FOR OPERATING A TEST AND MEASUREMENT SYSTEM

(71) Applicant: Rohde & Schwarz GmbH & Co. KG, München (DE)

(72) Inventor: Martin Peschke, München (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 193 days.

(21) Appl. No.: 15/475,461

(22) Filed: Mar. 31, 2017

(65) Prior Publication Data
US 2018/0284165 A1 Oct. 4, 2018

(51) Int. Cl.
*G01R 19/14* (2006.01)
*G01R 19/165* (2006.01)
*G01R 1/067* (2006.01)

(52) U.S. Cl.
CPC ... *G01R 19/16557* (2013.01); *G01R 1/06788* (2013.01)

(58) Field of Classification Search
CPC .......... G01R 19/165; G01R 19/16557; G01R 19/0092; G01R 1/06; G01R 1/067; G01R 1/06766; G01R 1/06722; G01R 1/06788; G01R 1/07307; G01R 1/06705; G01R 33/093; G01R 31/02
See application file for complete search history.

(56) References Cited

U.S. PATENT DOCUMENTS

| | | | | |
|---|---|---|---|---|
| 6,856,126 B2* | 2/2005 | McTigue | ........... | G01R 1/06766 324/149 |
| 2004/0085057 A1* | 5/2004 | McTigue | ............... | G01R 31/02 324/72.5 |
| 2006/0061348 A1* | 3/2006 | Cannon | .............. | G01R 1/06788 324/72.5 |
| 2006/0140349 A1* | 6/2006 | Tan | ....................... | G01R 35/005 379/30 |
| 2011/0006793 A1* | 1/2011 | Peschke | ............. | G01R 1/06766 324/754.01 |
| 2014/0320153 A1* | 10/2014 | Johnson | ............. | G01R 1/06788 324/713 |
| 2017/0227581 A1* | 8/2017 | Knierim | ............. | G01R 13/0254 |

* cited by examiner

*Primary Examiner* — Thang X Le
(74) *Attorney, Agent, or Firm* — Shumaker & Sieffert, P.A.

(57) ABSTRACT

A test and measurement system for testing a device under test comprises a logic probe with a first probe tip for contacting the device under test, a logic receiver unit connected to the first probe tip for receiving a digital signal from the device under test via the first probe tip, and a DC voltage measuring unit connected to the first probe tip for measuring a DC voltage at the device under test via the first probe tip.

20 Claims, 4 Drawing Sheets

TEST AND MEASUREMENT SYSTEM, DIFFERENTIAL LOGIC PROBE, SINGLE ENDED LOGIC PROBE AND METHOD FOR OPERATING A TEST AND MEASUREMENT SYSTEM

TECHNICAL FIELD

The present invention relates to a test and measurement system. The present invention further relates to a differential logic probe, a single ended logic probe and a method for operating a test and measurement system.

BACKGROUND

Although applicable in principal to any measurement system, the present invention and its underlying problem will be hereinafter described in combination with oscilloscopes.

In today's modern electronic industry a variety of different measurements and tests must be performed on electronic products during development and production.

For example oscilloscopes maybe used to record analogue voltage and/or current values. In addition, some oscilloscopes allow to record logic values, where the logic state, i.e. true/false, 1/0 or on/off, is recorded. Such logic values only show the logical content of the signals but cannot represent the waveform any more.

With such logic representations most of the properties of the original signal, like e.g. the analogue voltages, the mean voltage and the like are lost after the measurement.

Against this background, the problem addressed by the present invention is providing an improved measurement system.

SUMMARY

The present invention solves this object by a test and measurement system with the features of claim 1, a differential logic probe with the features of claim 14, a single ended logic probe with the features of claim 15 and a method for operating a test and measurement system with the features of claim 16.

Accordingly it is provided:

A test and measurement system for testing a device under test, the test and measurement system comprising a logic probe with a first probe tip for contacting the device under test, a logic receiver unit connected to the first probe tip for receiving a digital signal from the device under test via the first probe tip, and a DC voltage measuring unit connected to the first probe tip for measuring a DC voltage at the device under test via the first probe tip.

Further it is provided:

A differential logic probe for use in a test and measurement system for testing a device under test, the differential logic probe comprising a first probe tip and a second probe tip for contacting the device under test, a logic receiver unit connected to the first probe tip and the second probe tip for receiving a digital signal from the device under test via the first probe tip and the second probe tip, and a DC voltage measuring unit connected to the first probe tip and the second probe tip for measuring a DC voltage at the device under test via the first probe tip and the second probe tip.

Further it is provided:

A single ended logic probe for use in a test and measurement system for testing a device under test, the differential logic probe comprising a first probe tip for contacting the device under test, a logic receiver unit connected to the first probe tip for receiving a digital signal from the device under test via the first probe tip, and a DC voltage measuring unit connected to the first probe tip for measuring a DC voltage at the device under test via the first probe tip.

Finally, it is provided:

A method for operating a test and measurement system for testing a device under test, the method comprising contacting the device under test with a first probe tip of a logic probe, receiving a digital signal from the device under test via the first probe tip, and measuring a DC voltage at the device under test via the first probe tip.

The present invention provides an integrated test and measurement system with a logic probe that at the same time serves to measure the DC voltage of the logic signal via the same probe tip that is used for receiving the digital signal.

The present invention therefore allows contacting the device under test with a single probe tip and at the same time extracting two different types of information from the device under test or the digital signal.

The digital signal may be converted into a stream of ones and zeros that represent the content of the digital signal. In order to determine the value of the digital signal for a given moment, the voltage of the signal may be compared to a threshold value.

This threshold value will usually be predetermined. However, the voltage of the digital signal at the probe tip may be altered by e.g. common-mode errors or the like.

Therefore, if a fixed threshold value is used to determine the content or values of the digital signal, the common-mode errors may e.g. lead to a false content of the digital signal being detected.

With the present invention however it is now possible to measure the DC voltage of the digital signal and e.g. adapt the threshold voltage for determining a logic one or zero in the digital signal accordingly.

Further embodiments of the present invention are subject of the further subclaims and of the following description, referring to the drawings.

In a possible embodiment the test and measurement system may comprise a ground connector for coupling the test and measurement system to a common ground with the device under test.

By providing a common ground, the voltage at the first probe tip may easily be determined. Further, in a non-signaling state of the DUT the common-mode voltage or signal may be measured at the first probe tip. The term non-signaling state refers to a state in which the digital signal carries no content and is an idle state, e.g. 0 V (not including the common-mode signal or error).

In a possible embodiment the ground connector may comprise a ground type probe tip or a connector or clamp of the logic probe.

The ground connector may be provided locally at the logic probe. Since the probe is connected to a housing of the test and measurement system, this allows connecting the DUT to the ground connector without an additional cable to the housing of the test and measurement system.

In a possible embodiment the logic probe may be a differential probe and comprises a second probe tip.

The differential probe allows measuring the voltage between two different electric nodes of the DUT.

With a differential probe alone it is not possible to measure the common-mode signal that may be present in the two nodes. However, with the DC voltage measuring unit, especially in combination with the above mentioned ground connector, it is possible to measure the differential signal in the two nodes and at the same time or prior to measuring, it is possible to determine the common-mode signal in the two nodes.

The DC voltage measuring unit may e.g. measure the common-mode signal between the first probe tip and the ground connector, and/or between the second probe tip and the ground connector.

In a possible embodiment the first probe tip may comprise a positive input and the second probe tip may comprise a negative input of the differential probe, or vice versa.

In a possible embodiment the logic receiver unit may comprise a configurable threshold voltage generator that generates a threshold voltage and a comparator that determines the state of the digital signal based on the threshold voltage.

The configurable threshold voltage generator may e.g. be configured by a controller of the test and measurement system after a user selects a signal type for the digital signal.

The signal may e.g. be a unipolar signal, where a logic 1 is represented by a positive voltage and the logic 0 is represented by a voltage of 0 V or an absence of the positive voltage or vice versa. The threshold value may therefore e.g. be set to half the positive voltage.

The signal may also be bipolar, i.e. a logic 1 is represented by a positive voltage and a logic 0 is represented by a negative voltage or vice versa. The threshold value may therefore e.g. be set to 0 V.

In a possible embodiment the logic receiver unit may comprise a voltage configurator that configures the configurable threshold voltage generator based on the measured DC voltage.

The digital signal may for example be shifted up by a positive voltage or shifted down by a negative voltage. This shift may not be detected only with the logic receiver unit, since the logic receiver unit only comprises the comparator that acts based on the threshold voltage. Therefore, with a shifted signal level, the comparator may not detect the contents of the digital signal reliably. The threshold voltage must therefore be defined before the comparator starts analyzing the digital signal.

The measured DC voltage is an indication of such a shift of the voltage levels of the digital signal.

In a possible embodiment the DC voltage measuring unit may be configured to measure a mean value of the DC voltage at the device under test, wherein the voltage configurator may be configured to configure the configurable threshold voltage generator to generate a voltage that is equal to the mean value.

The mean value of the DC voltage may e.g. be half the maximum DC voltage that is measured at the device under test while the digital signal is actively transmitted, or in case of a differential signal, half the maximum voltage difference of the differential signal.

In a possible embodiment the DC voltage measuring unit may configured to measure a common-mode voltage part of the DC voltage at the device under test.

In a possible embodiment the voltage configurator may be configured to configure the configurable threshold voltage generator to generate a voltage based on the common-mode voltage part of the DC voltage.

Especially with differential digital probes a common-mode signal may not be detected in the digital signal and may cause errors in the device under test. Therefore, not only the threshold voltage may be correctly set, but a user may also be informed of the common-mode signal.

In a possible embodiment the test and measurement system may comprise a common-mode voltage comparator that compares the detected common-mode voltage part of the DC voltage with a predetermined common-mode limit value and provides a respective output signal.

The output signal may e.g. be processed by a central processing unit of the test and measurement system or may be provided to a user.

In a possible embodiment the test and measurement system may comprise a display device that displays the received digital signal and the DC voltage.

In a possible embodiment the display device may further display the detected common-mode voltage part of the DC voltage and e.g. the output signal of the common-mode voltage comparator and or the common-mode limit value.

It is understood, that the different elements of the test and measurement system may be freely distributed in the test and measurement system. For example, the logic receiver unit and the DC voltage measuring unit may be provided in the logic probe. As an alternative, the test and measurement system may e.g. comprise an oscilloscope or another test apparatus and the logic receiver unit may be provided in the oscilloscope or test apparatus while the DC voltage measuring unit may be provided in the logic probe or vice versa.

In addition, the single elements of the logic receiver unit and the DC voltage measuring unit may be freely distributed. For example the configurable threshold voltage generator may be provided in the oscilloscope or test apparatus or in the logic probe. The same applies to the comparator and the voltage configurator.

It is further understood that single elements of the test and measurement system may comprise not explicitly mentioned analogue or digital circuitry like e.g. filters, attenuators, amplifiers or the like that are necessary to perform the respective task.

For example the logic receiver unit may comprise filters that filter out any DC voltage from the digital signal, while the DC voltage measuring unit may comprise filters that filter out any signal having a frequency higher than a threshold frequency. The configurable threshold voltage generator may e.g. comprise analogue elements like e.g. resistors, voltage dividers, amplifiers or the like. The comparator may be a discrete comparator, and the voltage configurator may be any type of signal source. Further, at least part of the above described elements may also be implemented as firmware of computer executable instructions that are executed on at least one digital logic element of the test and measurement system.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated other-wise.

DETAILED DESCRIPTION OF THE DRAWINGS

Figure 1:
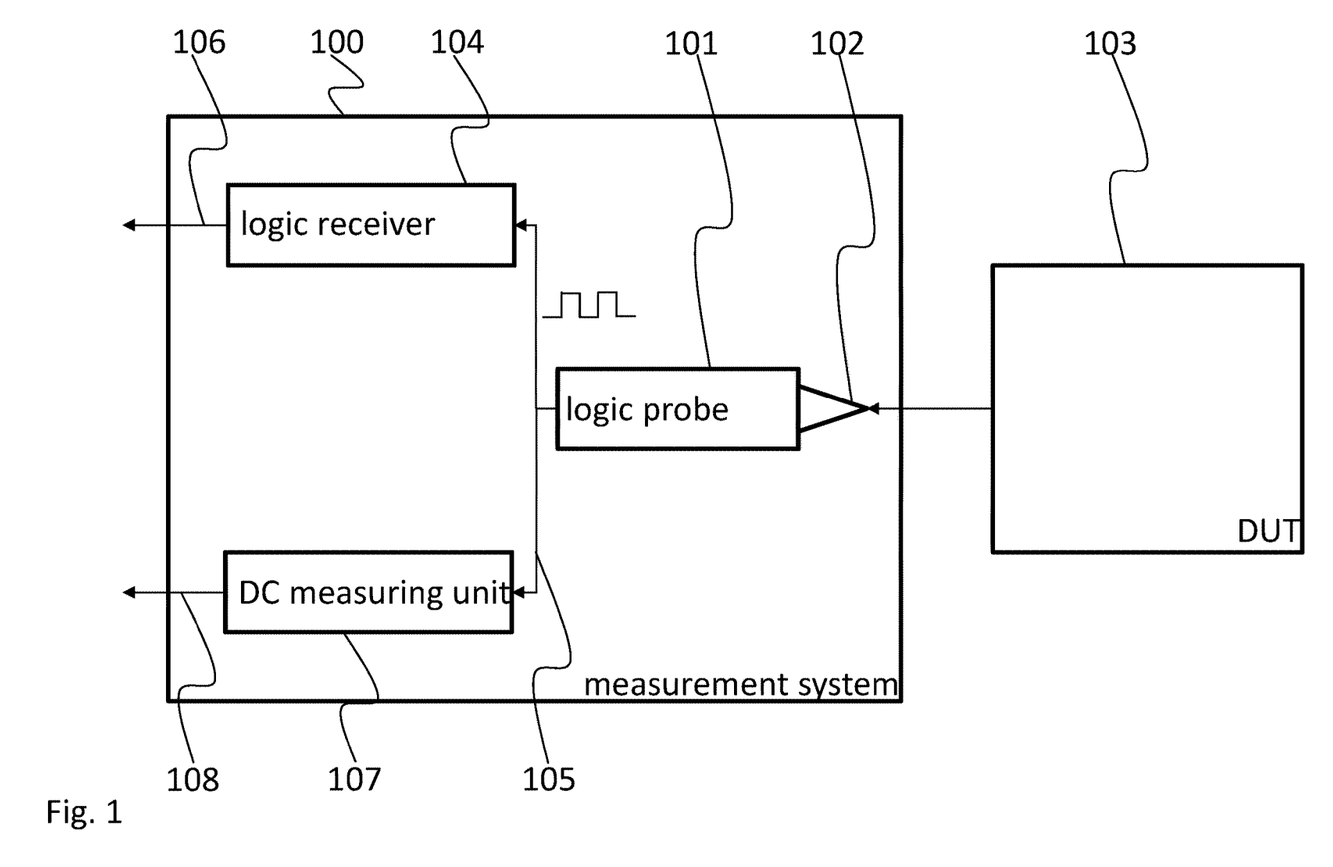
FIG. 1 shows a block diagram of an embodiment of a test and measurement system according to the present invention.

FIG. 1 shows a block diagram of a test and measurement system 100 for measuring signals in a device under test 103. The test and measurement system 100 comprises a logic probe 101 with a first probe tip 102 for contacting the device under test 103. The logic probe 101 is connected to a logic receiver unit 104 and to a DC voltage measuring unit 107.

The first probe tip 102 serves to contact the device under test 103 and receive a digital signal 105 from the device under test 103. Digital signal 105 in this context refers to a signal that carries digital content, i.e. 0s and 1s. It is understood, that the 0s and 1s of the digital signal 105 will be encoded either as voltage or current values. For example a voltage of 0 V may represent a logic 0 and a voltage of 5 V may represent a logic value of 1.

The logic probe 101 will forward the digital signal 105 to the logic receiver unit 104. The logic receiver unit 104 will then extract the logic values from the digital signal 105 and provide the signal content 106 e.g. to further processing means (not explicitly shown) of the test and measurement system 100.

The DC voltage measuring unit 107 also receives the digital signal 105 from the logic probe 101. However, the DC voltage measuring unit 107 does not extract any content from the digital signal 105. Instead the DC voltage measuring unit 107 will measure a DC voltage 108 of the digital signal 105. The DC voltage 108 may e.g. be a mean DC voltage or a common-mode part of the digital signal 105. It is understood, that the DC voltage measuring unit 107 may provide the DC voltage 108 as actual voltage value or as any other value, e.g. digital value, that may be mapped or represent the respective voltage.

In FIG. 1 the logic probe 101, the logic receiver unit 104 and the DC voltage measuring unit 107 are shown as separate units. It is however understood, that the logic probe 101, the logic receiver unit 104 and the DC voltage measuring unit 107 may be freely distributed in the test and measurement system 100. For example, the logic receiver unit 104 and/or the DC voltage measuring unit 107 or parts of these may be arranged in the logic probe 101. In addition, the logic receiver unit 104 and/or the DC voltage measuring unit 107 or parts of these may be arranged in an oscilloscope (not shown) of the test and measurement system 100.

The logic probe 101, the logic receiver unit 104 and the DC voltage measuring unit 107 may e.g. be seen as functional units, wherein it is irrelevant where the single elements of these functional units are arranged in the test and measurement system 100, as long as the respective function is provided. However, in an embodiment the logic receiver unit 104 and the DC voltage measuring unit 107 are provided in the logic probe 101.

Figure 2:
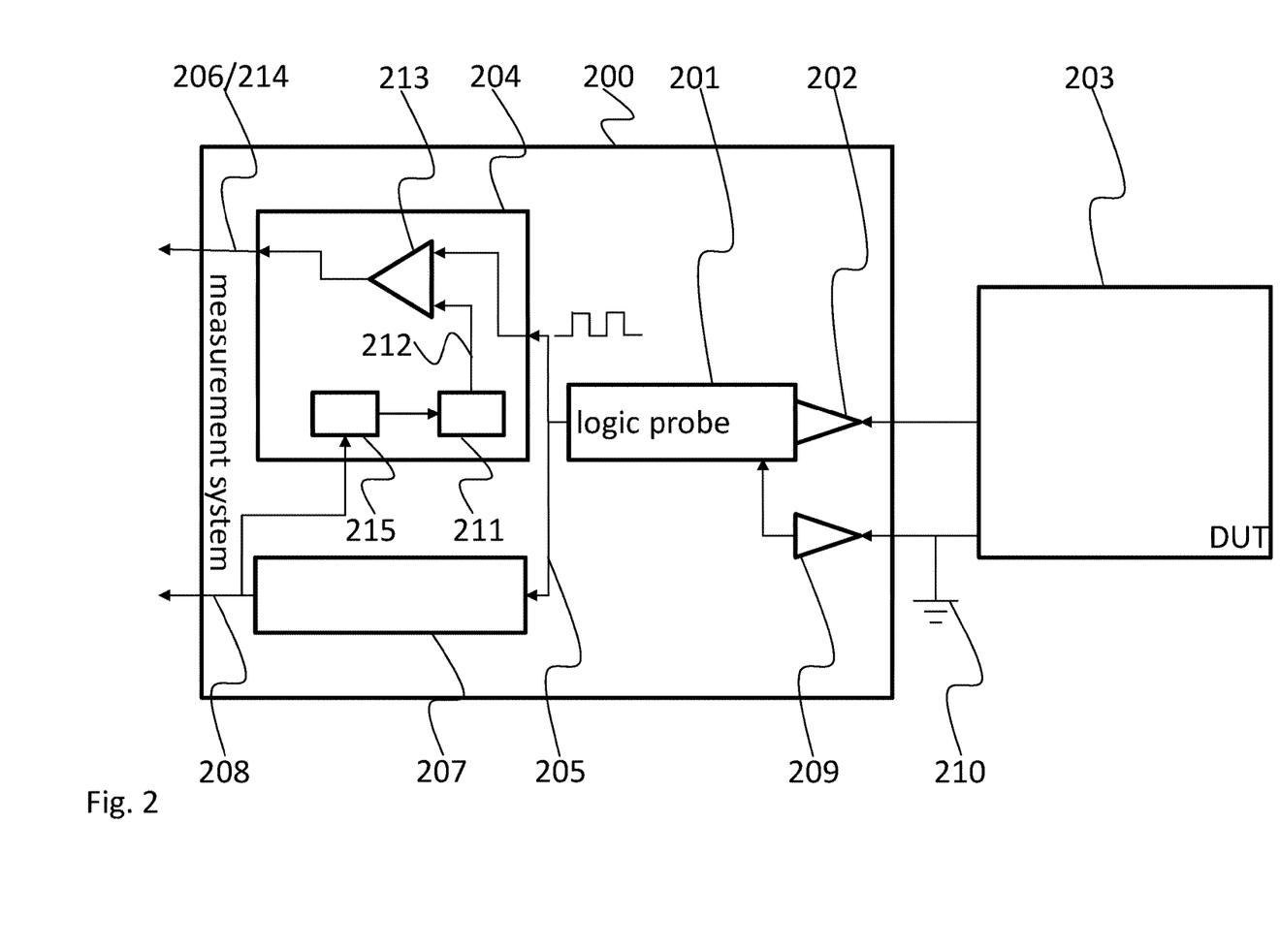
FIG. 2 shows a block diagram of another embodiment of a test and measurement system according to the present invention.

FIG. 2 shows a block diagram of another test and measurement system 200 that is based on the test and measurement system 100. The test and measurement system 200 therefore also comprises a logic probe 201 with a first probe tip 202, and a logic receiver unit 204 and a DC voltage measuring unit 207.

In addition the logic probe 201 comprises a ground type probe tip 209 or ground connector. The ground type probe tip 209 serves for contacting a ground signal 210 that is common between the device under test 203 and the test and measurement system 200. The logic probe 201 is therefore a single-ended probe 201.

The logic receiver unit 204 comprises a configurable threshold voltage generator 211 that is configured by a voltage configurator 215. The configurable threshold voltage generator 211 generates a threshold voltage 212 that is provided to a comparator 213.

The comparator 213 will compare the threshold voltage 212 to the signal level of the digital signal 205 and output a positive or logic 1 value, if the voltage level is higher than the threshold voltage 212, and a negative of logic 0 value, if the voltage level is lower than the threshold voltage 212, or vice versa.

The voltage configurator 215 may configure the configurable threshold voltage generator 211 based on the DC voltage 208 that is provided by the DC voltage measuring unit 207, e.g. the mean voltage of the digital signal 205.

With the help of the DC voltage 208 and the voltage configurator 215 the logic receiver unit 204 is capable of adapting to different voltage levels of the digital signal 105 automatically and no manual intervention or configuration by a user is necessary any more. Further, an indication of the DC voltage 208 may also be provided to a user and the user may thus detect any deviations of the DC voltage 208 from a desired or standard value.

Figure 3:
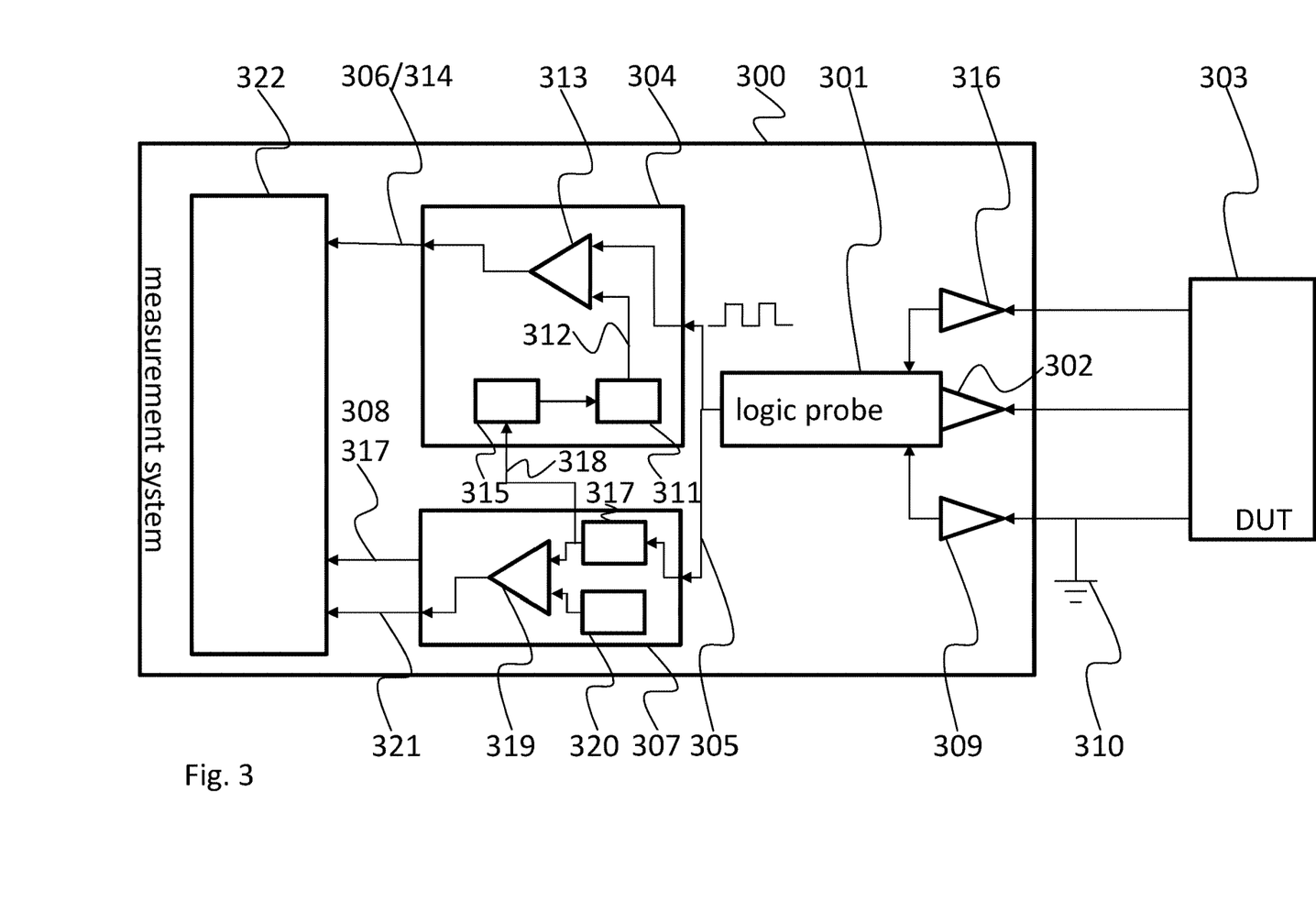
FIG. 3 shows a block diagram of another embodiment of a test and measurement system according to the present invention.

FIG. 3 shows a block diagram of another test and measurement system 300. The test and measurement system 300 is based on the test and measurement system 200 and therefore comprises a logic probe 301 with a first probe tip 302 and the ground type probe tip 309, a logic receiver unit 304 as described in conjunction with FIG. 2, and a DC voltage measuring unit 307.

In addition, the logic probe 301 comprises a second probe tip 316. The second probe tip 316 also serves to contact the device under test 303 and receive a signal from the device under test 303. The logic probe 301 therefore may be seen as differential logic probe 303.

The logic probe 301 may provide the differential signal by itself to the logic receiver unit 304 and the DC voltage measuring unit 307. As an alternative or in addition the logic probe 301 may also provide the raw signals received by the first probe tip 302 and the second probe tip 316 to the logic receiver unit 304 and the DC voltage measuring unit 307.

The DC voltage measuring unit 307 comprises a voltage extractor 317 that extracts a common-mode voltage part 318 from the digital signal 305. The voltage extractor 317 may also extract the mean value of the voltages in the digital signal The voltage configurator 315 of the logic receiver unit 304 receives this common-mode voltage part 318 and configures the configurable threshold voltage generator 311 based on this common-mode voltage part 318.

In addition, the DC voltage measuring unit 307 comprises a common-mode voltage comparator 319 that compares the common-mode voltage part 318 to a common-mode limit value 320 and provides a respective output signal 321.

Finally, the test and measurement system 300 also comprises a display device 322. The display device 322 may e.g. be used to display the signal content 306 and/or the common-mode voltage part 318 and/or the output signal 321 and/or the common-mode limit value 320 to the user.

The display device 322 may e.g. be the display device 322 of an oscilloscope (not shown) or the like.

It is understood, that the features of the different test and measurement systems 100, 200, 300 may be freely combined. For example the display device 322 may be used with the test and measurement system 100 or the test and measurement system 200. Further, the DC voltage measuring unit 307 may e.g. also be used with the test and measurement system 100 or the test and measurement system 200. Finally, the test and measurement system 100, the test and measurement system 200 and the test and measurement system 300 may all be used either with a single-ended probe 201 or with a differential probe 301.

For sake of clarity in the following description of the method based FIG. 4 the reference signs used above in the description of apparatus based FIGS. 1-3 will be maintained.

Figure 4:
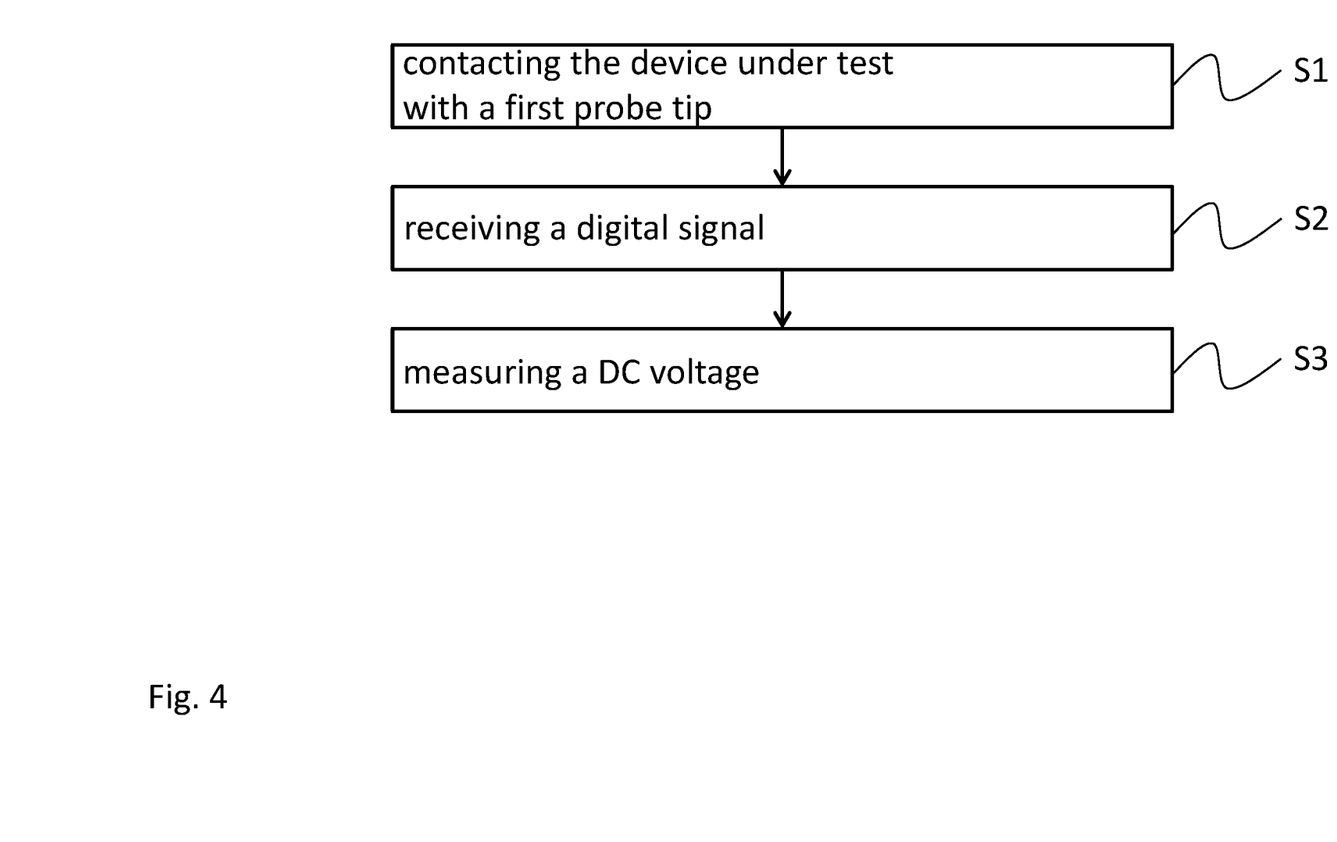
FIG. 4 shows a flow diagram of an embodiment of a method for operating a test and measurement system according to the present invention.

FIG. 4 shows a flow diagram of a method for operating a test and measurement system 100, 200, 300 for testing a device under test 103, 203, 303.

The method comprises contacting S1 the device under test 103, 203, 303 with a first probe tip 102, 202, 302 of a logic probe 101, 201, 301. In addition, a digital signal 105, 205, 305 is received S2 from the device under test 103, 203, 303 via the first probe tip 102, 202, 302, and a DC voltage 108, 208, 308 is measured S3 at the device under test 103, 203, 303 via the first probe tip 102, 202, 302.

The method may further comprise coupling the test and measurement system 100, 200, 300 to a common ground 210, 310 with the device under test 103, 203, 303. The connection may e.g. be performed with a ground connector 209, 309, like e.g. a ground type probe tip of the logic probe 101, 201, 301.

The method may e.g. comprise generating a threshold voltage 212, 312 and determining the state of the digital signal 105, 205, 305 based on a comparison of a signal level of the digital signal 105, 205, 305 and the threshold voltage 212, 312, especially wherein the threshold voltage 212, 312 is generated based on the measured DC voltage 108, 208, 308.

The logic probe 101, 201, 301 may be a differential probe and may comprises a second probe tip 316. The first probe tip 102, 202, 302 may e.g. comprise a positive input and the second probe tip 316 may e.g. comprise a negative input. The method may then further comprise contacting the device under test 103, 203, 303 with the second probe tip 316.

Measuring S3 a DC voltage 108, 208, 308 can comprise measuring a mean value of the DC voltage 108, 208, 308 at the device under test 103, 203, 303. The threshold voltage 212, 312 may be generated equal to the mean value of the DC voltage 108, 208, 308.

Further, measuring a DC voltage 108, 208, 308 may comprise measuring a common-mode voltage part 318 of the DC voltage 108, 208, 308 at the device under test 103, 203, 303. The threshold voltage 212, 312 may then be generated based on the common-mode voltage part 318 of the DC voltage 108, 208, 308. The method may further comprise comparing the detected common-mode voltage part 318 of the DC voltage 108, 208, 308 with a predetermined common-mode limit value 320 and providing a respective output signal.

Finally, the method may comprise displaying the received digital signal 105, 205, 305 and the DC voltage 108, 208, 308, and especially displaying the detected common-mode voltage part 318 of the DC voltage 108, 208, 308.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 100, 200, 300 test and measurement system
101, 201, 301 logic probe
102, 202, 302 first probe tip
103, 203, 303 device under test
104, 204, 304 logic receiver unit
105, 205, 305 digital signal
106, 206, 306 signal content
107, 207, 307 DC voltage measuring unit
108, 208, 308 DC voltage
209, 309 ground connector
210, 310 common ground
211, 311 configurable threshold voltage generator 212, 312 threshold voltage
213, 313 comparator
214, 314 state
215, 315 voltage configurator
316 second probe tip
317 common-mode voltage extractor
318 common-mode voltage part
319 common-mode voltage comparator
320 common-mode limit value
321 output signal
322 display device
S1-S3 method steps

The invention claimed is:

1. A test and measurement system for testing a device under test, the test and measurement system comprising:
 a logic probe with a first probe tip for contacting the device under test,
 a logic receiver unit connected to the first probe tip for receiving a digital signal from the device under test via the first probe tip, and
 a DC voltage measuring unit connected to the first probe tip for measuring a DC voltage at the device under test via the first probe tip.

2. The test and measurement system of claim 1, comprising a ground connector for coupling the test and measurement system to a common ground with the device under test.

3. The test and measurement system of claim 2, wherein the ground connector comprises a ground type probe tip of the logic probe.

4. The test and measurement system of claim 1, wherein the logic probe is a differential probe and comprises a second probe tip.

5. The test and measurement system of claim 4, wherein the first probe tip comprises a positive input and the second probe tip comprises a negative input.

6. The test and measurement system of claim 1, wherein the logic receiver unit comprises a configurable threshold voltage generator that generates a threshold voltage and a comparator that determines the state of the digital signal based on the threshold voltage.

7. The test and measurement system of claim 6, wherein the logic receiver unit comprises a voltage configurator that configures the configurable threshold voltage generator based on the measured DC voltage.

8. The test and measurement system of claim 7, wherein the DC voltage measuring unit is configured to measure a mean value of the DC voltage at the device under test, and wherein the voltage configurator is configured to configure the configurable threshold voltage generator to generate a voltage that is equal to the mean value.

9. The test and measurement system of claim 1, wherein the DC voltage measuring unit is configured to measure a common-mode voltage part of the DC voltage at the device under test.

10. The test and measurement system of 7, wherein the voltage configurator is configured to configure the configurable threshold voltage generator to generate a voltage based on a common-mode voltage part of the DC voltage.

11. The test and measurement system of claim 9, comprising a common-mode voltage comparator that compares the detected common-mode voltage part of the DC voltage with a predetermined common-mode limit value and provides a respective output signal.

12. The test and measurement system of claim 1, comprising a display device that displays the received digital signal and the DC voltage.

13. The test and measurement system of claim 12, wherein the display device further displays a detected common-mode voltage part of the DC voltage.

14. A differential logic probe for use in a test and measurement system for testing a device under test, the differential logic probe comprising:
 a first probe tip and a second probe tip for contacting the device under test,
 a logic receiver unit connected to the first probe tip and the second probe tip for receiving a digital signal from the device under test via the first probe tip and the second probe tip, and
 a DC voltage measuring unit connected to the first probe tip and the second probe tip for measuring a DC voltage at the device under test via the first probe tip and the second probe tip.

15. A single ended logic probe for use in a test and measurement system for testing a device under test, the single ended probe comprising:
 a first probe tip for contacting the device under test,
 a logic receiver unit connected to the first probe tip for receiving a digital signal from the device under test via the first probe tip, and
 a DC voltage measuring unit connected to the first probe tip for measuring a DC voltage at the device under test via the first probe tip.

16. A method for operating a test and measurement system for testing a device under test, the method comprising:
 contacting the device under test with a first probe tip of a logic probe;
 receiving, by a logic receiver unit, a digital signal from the device under test via the first probe tip; and
 measuring, by a DC voltage measuring unit, a DC voltage at the device under test via the first probe tip.

17. The method of claim 16, comprising coupling the test and measurement system to a common ground with the device under test, especially with a ground connector that especially comprises a ground type probe tip of the logic probe.

18. The method of claim 16, wherein the logic probe is a differential probe and comprises a second probe tip, especially wherein the first probe tip comprises a positive input and the second probe tip comprises a negative input, and wherein the method comprises contacting the device under test with the second probe tip; and/or
 wherein the method comprises generating a threshold voltage and determining the state of the digital signal based on a comparison of a signal level of the digital signal and the threshold voltage, especially wherein the threshold voltage is generated based on the measured DC voltage, and/or
 wherein measuring a DC voltage comprises measuring a mean value of the DC voltage at the device under test, and wherein the threshold voltage is generated equal to the mean value of the DC voltage.

19. The method of claim 18, wherein measuring the DC voltage comprises measuring a common-mode voltage part of the DC voltage at the device under test, and especially wherein the threshold voltage is generated based on the common-mode voltage part of the DC voltage, especially wherein the method comprises comparing the detected common-mode voltage part of the DC voltage with a predetermined common-mode limit value and providing a respective output signal.

20. The method of claim 16, comprising displaying the received digital signal and the DC voltage, and especially displaying the detected common-mode voltage part of the DC voltage.

* * * * *